(12) United States Patent
Yanagisawa

(10) Patent No.: US 10,412,868 B2
(45) Date of Patent: Sep. 10, 2019

(54) SYSTEM AND METHOD FOR SEPARATING WORKPIECES

(71) Applicant: Nagaoka Seisakusho Corp., Nagano (JP)

(72) Inventor: Soichi Yanagisawa, Nagano (JP)

(73) Assignee: Nagaoka Seisakusho Corp., Nagano (JP)

( * ) Notice: Subject to any disclaimer, the term of this patent is extended or adjusted under 35 U.S.C. 154(b) by 0 days.

(21) Appl. No.: 15/445,471

(22) Filed: Feb. 28, 2017

(65) Prior Publication Data
US 2017/0257989 A1   Sep. 7, 2017

(30) Foreign Application Priority Data

Mar. 4, 2016  (JP) ................ 2016-042317

(51) Int. Cl.
*B65G 59/00* (2006.01)
*H05K 13/00* (2006.01)
*H05K 13/02* (2006.01)
*B65G 59/04* (2006.01)

(52) U.S. Cl.
CPC ........ *H05K 13/0061* (2013.01); *B65G 59/00* (2013.01); *B65G 59/045* (2013.01); *H05K 13/0069* (2013.01); *H05K 13/021* (2013.01); *B65G 2814/0308* (2013.01)

(58) Field of Classification Search
CPC .......... H05K 13/0061; H05K 13/0069; H05K 13/021; B65G 59/00; B65G 2814/0308; B65G 59/02; B65G 59/023; B65G 59/026

USPC .............. 414/795.4, 796.5, 796.7, 796.9
See application file for complete search history.

(56) References Cited

U.S. PATENT DOCUMENTS

| | | | | |
|---|---|---|---|---|
| 4,815,916 | A * | 3/1989 | Beck ............... | B65G 59/04 271/154 |
| 5,192,848 | A * | 3/1993 | Miyakawa ....... | B23K 26/0838 219/121.63 |
| 5,263,569 | A * | 11/1993 | Hiramoto ........ | B65B 15/04 198/468.4 |
| 6,402,456 | B1 * | 6/2002 | van Walderveen | B65G 1/07 414/794.9 |

FOREIGN PATENT DOCUMENTS

| | | | |
|---|---|---|---|
| JP | 60-072727 A | 4/1985 | |
| JP | 1-164243 | * 11/1989 | ........ G65H 3/00 |
| JP | 2155300 A | 6/1990 | |
| JP | 60-072727 | * 4/1995 | ........ B41F 15/26 |
| JP | 2016-168152 | 8/2010 | |
| JP | 2011-3641 | * 1/2011 | ........ H05K 13/02 |

* cited by examiner

*Primary Examiner* — Lynn E Schwenning
(74) *Attorney, Agent, or Firm* — Blank Rome LLP

(57) ABSTRACT

A system for separating a workpiece from workpieces is provided. The system includes a stocker on which a plurality of workpieces are stored in a stacked state, a holding unit including at least one pair of inverted V-shaped pads that sandwich and clamp both ends of one of the workpieces, and a moving unit that moves at least one of the holding unit and the stocker so as to relatively move the stocker downward with respect to the holding unit, which is in a state where the one of the workpieces is clamped by the at least one pair of pads, and to separate the one of the workpieces from other workpieces.

8 Claims, 5 Drawing Sheets

SYSTEM AND METHOD FOR SEPARATING WORKPIECES

RELATED APPLICATIONS

This application claims the benefit of Japanese Patent Application No. 2016-042317, filed on Mar. 4, 2016. The content of that application is hereby incorporated by reference.

TECHNICAL FIELD

The present invention relates to a system and a method for separating a single workpiece from a plurality of stacked workpieces.

BACKGROUND ART

Japanese Laid-open Patent Publication No. 2010-168152 discloses the provision of a substrate fetching apparatus that is multifunctional, has a compact and simple construction, and has a high-throughput for fetching substrates from a box and passing the substrates over to another box or a conveying apparatus. In this Document, the substrate fetching apparatus that fetches from a plurality of substrates, which are housed by being aligned so as to be vertically inserted inside a box with a lid, one at a time and transfers the substrate to another apparatus includes: a pair of movement rails that are parallel and are provided on the left and right sides of the box; carriers that are provided so as to freely move on the pair of movement rails; an elevator body that is coupled to both carriers and freely moves up and down along a height direction of the carriers; a raising and lowering mechanism that raises and lowers the elevator body along the height direction of the carriers; a lid clamping means provided on the elevator body so as to face the lid of the box; a substrate clamping means that is provided on the elevator body and holds a substrate so that the vertical state and the horizontal state of the substrate are freely rotatable; and a rotating mechanism that rotationally drives the substrate clamping means.

SUMMARY OF INVENTION

There is demand for a system that facilitates the fetching of workpieces, such as stacked printed circuit boards and other substrates, one at a time from a stack of workpieces reliably.

One aspect of the present invention is a system (a workpiece separation apparatus) including: a stocker in which a plurality of workpieces are stored in a stacked state; a holding unit including at least one pair of inverted V-shaped pads that sandwich and clamp both ends of one of the workpieces; and a moving unit that moves at least one of the holding unit and the stocker so as to relatively moves the stocker downward with respect to the holding unit, which is in a state where the one of the workpieces is clamped by the at least one pair of pads, and to separate the one of the workpieces from other workpieces. One example of a workpiece is a plate (substrate) such as a printed circuit board.

In this system, the holding unit clamps and holds both ends of a workpiece using a pair of pads in a shape that downwardly widens (an inverted V-shape, a "triangle with an open base", or an "inwardly inclined shape"). This means that by holding the uppermost workpiece out of the plurality of workpieces stacked on the stocker using the holding unit and relatively lowering the stocker with respect to the holding unit (relatively raising the holding unit with respect to the stocker), it is possible to separate one workpiece at a time from a plurality of stacked workpieces. Accordingly, it is possible to fetch workpieces one at a time precisely and reliably from stacked workpieces.

In addition, with this system, since both end portions of a workpiece are clamped by one or more pairs of pads, it is possible to separate a workpiece without clamping the front surface and/or rear surface of the workpiece. This means that it is possible to reliably fetch workpieces one at a time from the workpieces stacked on the stocker regardless of the states of the front surface and the rear surface of the workpiece, even if, for example, there are through-holes in the workpiece and even if circuit components or the like have been mounted on the workpiece. In addition, it is possible to prevent marking and damage to the surface of the workpiece, the components that have been mounted on the workpiece, and the like.

This system may also include a conveying unit that relatively moves in and out below the holding unit and conveys the workpiece released from the holding unit. The workpiece separated by the holding unit is held in a state where the workpiece is sandwiched between inverted V-shaped pads that downwardly widen and is released below the holding unit from the pair of pads. This means that by disposing the conveying unit below the holding unit, it is possible to convey downstream (i.e., to the next process) workpieces that have been separated one at a time.

The conveying unit may be an apparatus that moves in and out between the holding unit and the stocker. By having the conveying unit move in and out between the holding unit and the stocker, it is not necessary for the holding unit to move forward and backward or left and right in a state where the workpiece is held, and possible to provide a system that is simple and highly reliable and can reduce the takt time or average time of processing.

The conveying unit that moves in and out between the holding unit and the stocker may include a pair of feeding units that move to first positions, which are below the holding unit and are withdrawn to an outside from both ends of a plurality of stacked workpieces, and to second positions, which are located inside of the first positions so that undersides (lower sides) at both ends of the separated workpiece are loaded. By withdrawing the pair of feeding units to the first positions, it is possible to move the holding unit and the stocker relative to one another to separate one workpiece from the workpieces stacked on the stocker and, by moving the feeding units to the second positions, to convey the workpiece released from the holding unit.

The holding unit of the system may include a driving unit that opens and closes the at least one pair of pads relative to both ends of the workpiece to be separated. Although it is also possible to clamp a workpiece by pressing inverting V-shaped pads that widen downwards onto a top of stacked workpieces from above, by opening and closing the pair of pads, it is possible to reliably clamp and release the one of the workpieces.

The holding unit may include a support unit that supports the at least one pair of pads in a state where the at least one pair of pads are pressed onto both ends of the one of the workpieces so that a distance (gap) between the at least one pair of pads changes in a front-rear direction along both ends of the workpiece to be separated. When the workpiece to be separated is inclined and/or the dimensions of the workpiece are partially different, by changing the distance between the pair of pads in the front/rear direction of the workpiece, it becomes easy for the inverted V-shaped pads to clamp the workpiece. The holding unit may include a plurality of pairs of pads and the support unit may support the plurality of pairs of the pads so that distances between the pads change in the front/rear direction along both ends of the workpiece.

In addition, the moving unit of the system may have a function to move the stocker above the holding unit to the position where a plurality of workpieces are stacked. It is possible for operators or a system that conveys workpieces from a previous process to load a plurality of workpieces onto the stocker simply in a short time. Then the moving unit moves the stocker below the holding unit to start the workpiece separation operation.

Another aspect of the present invention is a method that includes separating one of workpieces from other workpieces by using the system stated above. The system includes a stocker on which a plurality of plate-like workpieces are loaded in a stacked state and a holding unit with at least one pair of inverted V-shaped pads that clamp both ends of one of the workpieces. The separating one of workpieces includes the following steps.

1. Moving at least one of the holding unit and the stocker relatively to the other so that the at least one pair of pads hold an uppermost workpiece stacked on the stocker.
2. Moving at least one of the holding unit and the stocker, after the pair of pads have held the uppermost workpiece, so that the stocker is downward with respect to the holding unit to separate the one of the workpieces.

The system may further include a conveying unit that moves in and out between the holding unit and the stocker and conveys the workpiece, and in this case, the method may include the following steps.
3. Setting the conveying unit between the holding unit and the stocker.
4. Releasing the workpiece held by the at least one pair of pads.
5. Conveying the released workpiece using the conveying unit.
6. Withdrawing the conveying unit from between the stocker and the holding unit.

The method may further include, once the separating one of workpieces mounted on the stocker have been completed, the following steps to load next workpieces.

Moving the stocker above the holding unit to the position where a plurality of workpieces are stacked.

Moving the stocker on which a plurality of workpieces are stacked below the holding unit.

BRIEF DESCRIPTION OF DRAWINGS

FIG. 4A is a view where the stocker has been raised, FIG. 4B is a view where the holding unit clamps a workpiece, FIG. 4C is a view where the holding unit has been lowered, FIG. 4D is a view where the conveying unit has been inserted between the stocker and the holding unit, and FIG. 4E is a view where a workpiece that has been released by the holding unit is being conveyed;

DETAIL DESCRIPTION

Figure 1:
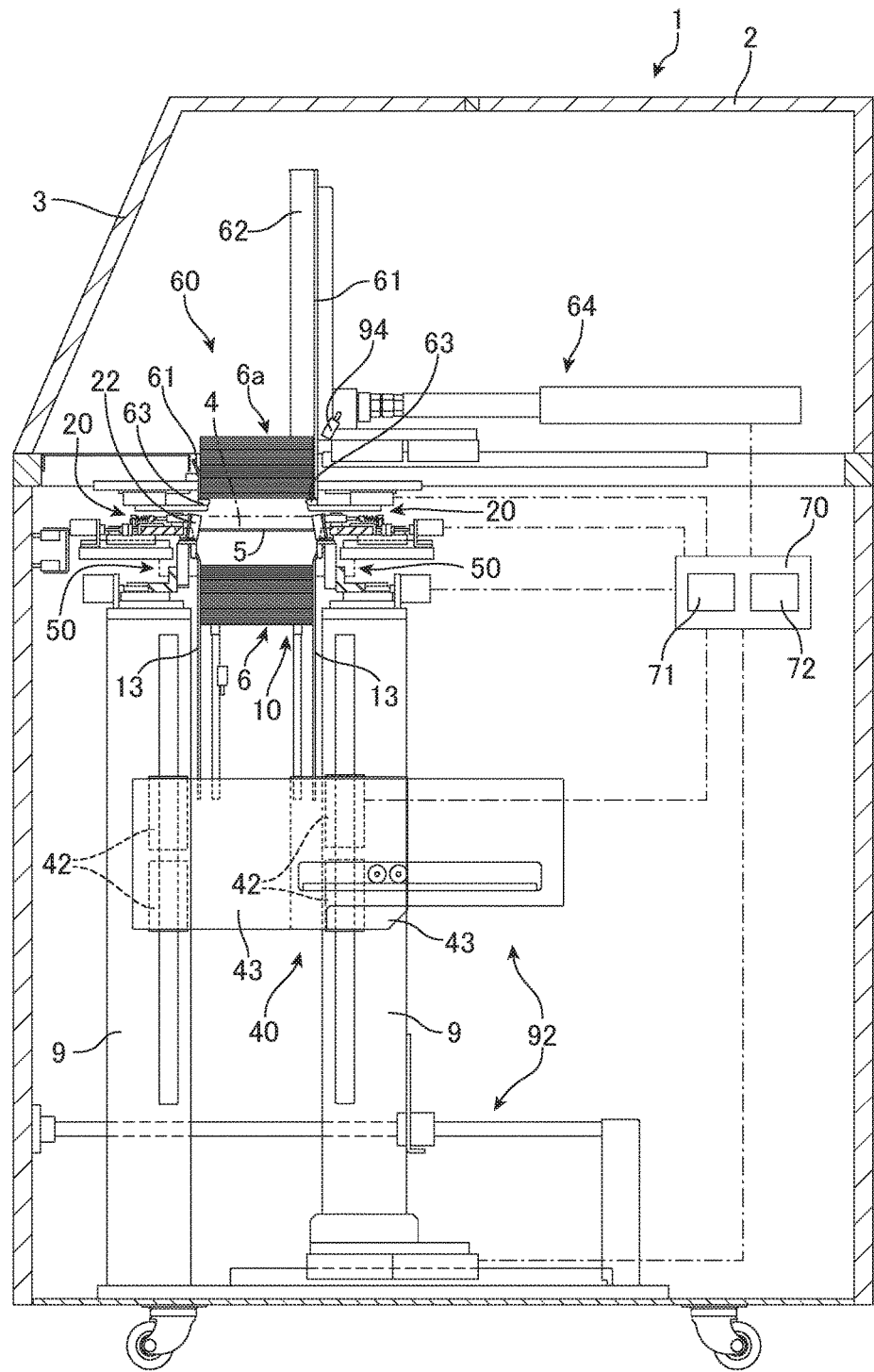
FIG. 1 is a side view showing, by way of a cross section, the overall configuration of a system that processes workpieces.

FIG. 1 shows, by way of a cross-sectional view taken from the side, the overall configuration of one example of a system that separates and conveys substrates. This system 1 grasps and separates a substrate 5 (or "workpiece" or "printed circuit board") and supplies the substrates one at a time from the stacked substrates 6. The plurality of substrates 6 that have been stacked (directly loaded) on a stocker 10 are the plate-like workpieces. The system is equipped with a function as a workpiece separation device that separates substrates that are workpieces and a function as a feeding device that supplies the separated workpiece to the next process, and is referred to as "work supplying system", "substrate feeding apparatus", "chucking loader" or the like. The system is described hereafter as a "substrate feeding system" (or "substrate feeding apparatus") 1.

The substrate feeding apparatus (substrate supplying system) 1 includes the stocker 10 in which a stacked plurality of substrates 6 are loaded, a holding unit 20 including one pair or a plurality of pairs of pads 22 that have an inverted V shape and sandwich and clamp both ends of one substrate 5, and a moving unit 40 that moves the stocker 10 up and down. In the system 1, the moving unit 40 is configured so as to move the stocker (or "lifter") 10 up and down, and includes a pair of stands 9, and air cylinders (or "actuators" or a "moving unit") 42 that move the stocker 10 up and down on a pair of stands 9 via a pair of transmission members 43. The actuators 42 may be electric or another type. The moving unit 40 may be a unit that moves the holding unit 20 instead of the stocker 10 or may be a unit that moves both the stocker 10 and the holding unit 20.

The substrate feeding apparatus 1 further includes a conveying unit (or "conveying apparatus") 50, which is disposed below the holding unit 20 and moves in and out between the holding unit 20 and the stocker 10, in more detail, that moves in the above the stocker 10 when the stocker 10 has been lowered, to convey a workpiece 5 that has been released from the holding unit 20, and a control unit 70 that controls the operations of the other units. The control unit 70 includes a feeding function (feeding unit) 71 that clamps and supplies the uppermost workpiece 5 from the plurality of stacked substrates 6. The substrate feeding apparatus 1 is capable of flexibly supporting substrates 6 of different widths without fixing the width of substrates 6 to be separated and supplied. This means that the control unit 70 includes an adjustment function (adjustment unit) 72 that adjusts the gaps (distances) between the respective parts of the substrate feeding apparatus 1 in the width direction of the substrates 6 when substrates 6 of different widths to be separated and supplied are to be set (loaded) to the stocker 10.

The stocker 10, the holding unit 20, the moving unit 40, and the conveying unit 50 are housed inside a housing 2 of the system 1. The substrate feeding apparatus 1 further includes, in the upper part of the housing 2, a loading unit 60 that holds substrates (a workpiece bundle) 6a to be processed in the next batch in a stacked state, a loading door 3 for loading the substrates 6a provided on the housing 2 at an upper part of the front surface, and a sensor 94 that monitors whether the substrates 6a have been loaded. As stated above, the widths of substrates 6a to be processed in the next batch may vary.

The moving unit 40 of the substrate feeding apparatus 1 includes a function that raises the stocker 10 above the holding unit 20 to the position of the loading unit 60 (the position where new workpieces are loaded or the "loading position"). After the stocker 10 has been raised to the loading position, the substrates 6a stacked in advance are moved to the stocker 10 by sliding and releasing the workpiece holders 63 that support the periphery of both ends of the substrates 6a in the loading unit 60.

The loading unit 60 includes: the first pair of guides 61 that perform positioning in the width direction of the substrate 5, the second guide 62 that performs positioning in the length direction of the substrate 5, the pair of workpiece holders 63 that support, from below, the bundle of substrates 6a that have been loaded into the loading unit 60, and the first width changing unit 64 that slidably drives the first pair of guides 61 and the pair of workpiece holders 63 in the width direction so that the width matches the substrates 6a to be received. By setting the width of the substrates 6a to be received in advance to the control unit 70, it is possible to change the setting size of the substrates 6a to be separated and supplied during an operation that separates and supplies substrates. In addition, with the substrate feeding apparatus 1, by providing the loading unit 60 at the top of the substrate feeding apparatus 1, it is possible to load and set the substrates 6a to be separated and supplied from above the apparatus 1, which makes the loading operation easier.

The moving unit 40 first lowers the stocker 10 in which the substrates 6 are loaded to a position where the uppermost substrate 6 is below the holding unit 20. Then the moving unit 40 raises the stocker 10 to a position where the uppermost substrate 6 is at the position of the holding unit 20. After the holding unit 20 has picked up the uppermost substrate 5 in the stocker 10 and the stocker 10 has then been lowered to separate the uppermost substrate 5, the conveying unit 50 is introduced below the holding unit 20 and above the stocker 10 so that the substrate 5 that has been released downward from the holding unit 20 is received by the conveying unit 50. The conveying unit 50 feeds the separated substrate 5 from an opening (discharge opening) 4 formed in the side surface of the system 1 to the next process for the substrate 5, or to a belt conveyor or the like connected to the system 1. By repeating this process, the plurality of substrates 6 stored on the stocker 10 are separated one at a time as the "substrate 5" which is supplied to the next process.

With the substrate feeding apparatus 1, by moving the stocker 10 up and down, the moving unit 40 receives the substrates 6 from the loading unit 60, carries them to the holding unit 20, and separates them one at a time. Instead of moving the stocker 10 up and down, the moving unit 40 may move the holding unit 20 up and down, or may move both the stocker 10 and the holding unit 20 up and down relative to one another.

Also, the substrate feeding apparatus 1 is configured so as to be capable of receiving a plurality of types of substrates 6 and 6a of different widths and of separating the substrates one at a time on a job-by-job basis. To do so, the substrate feeding apparatus 1 includes a first width changing unit 64 that adjusts the size of the substrates 6a to be received at the loading unit 60 and a second width changing unit 92 that adjusts the size of the substrates 6 to be separated.

The second width changing unit 92 adjusts, except the loading unit 60, the widths of the stocker 10, the holding unit 20, and the conveying unit 50. The second width changing unit 92 changes the width of the pair of stands 9 that support the stocker 10, the holding unit 20, and the conveying unit 50 according to instructions of the width adjusting function 72 of the control unit 70. If the width of the substrates 6a to be separated and supplied by the next job that have been loaded onto the loading unit 60 is different, the width adjusting function 72 automatically matches the widths of the stocker 10, the holding unit 20, and the conveying unit 50 to the width of the substrates 6a held by the loading unit 60 when moving the substrates 6a to the stocker 10 from the loading unit 60.

Figure 2:
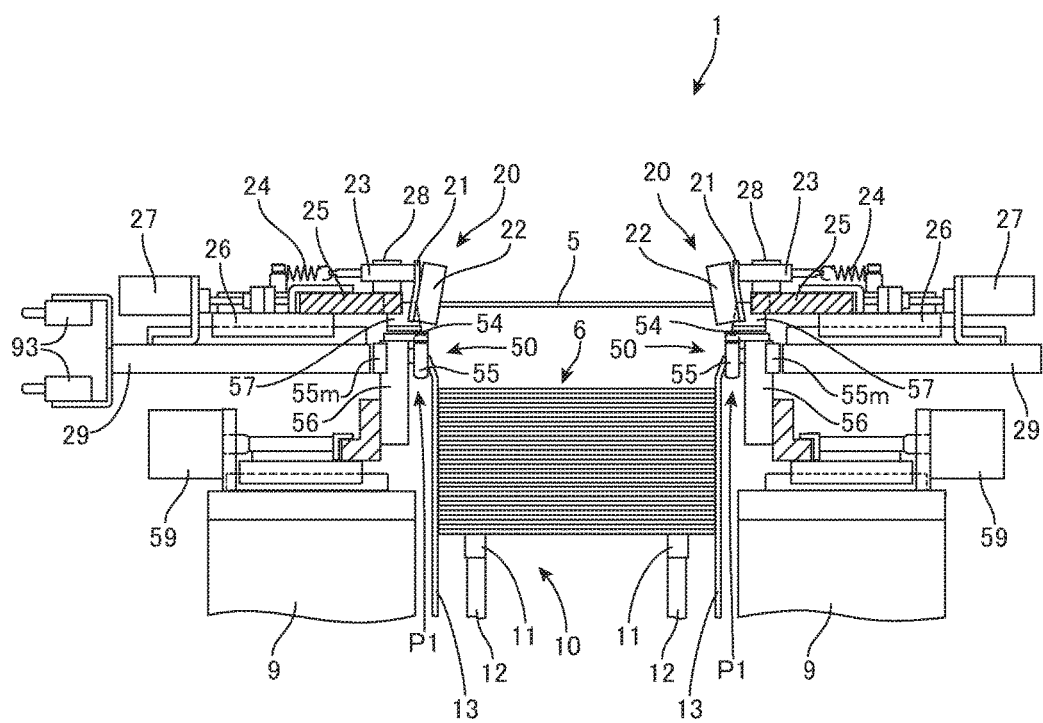
FIG. 2 is a side view showing an area about the holding unit in enlargement.
Figure 3:
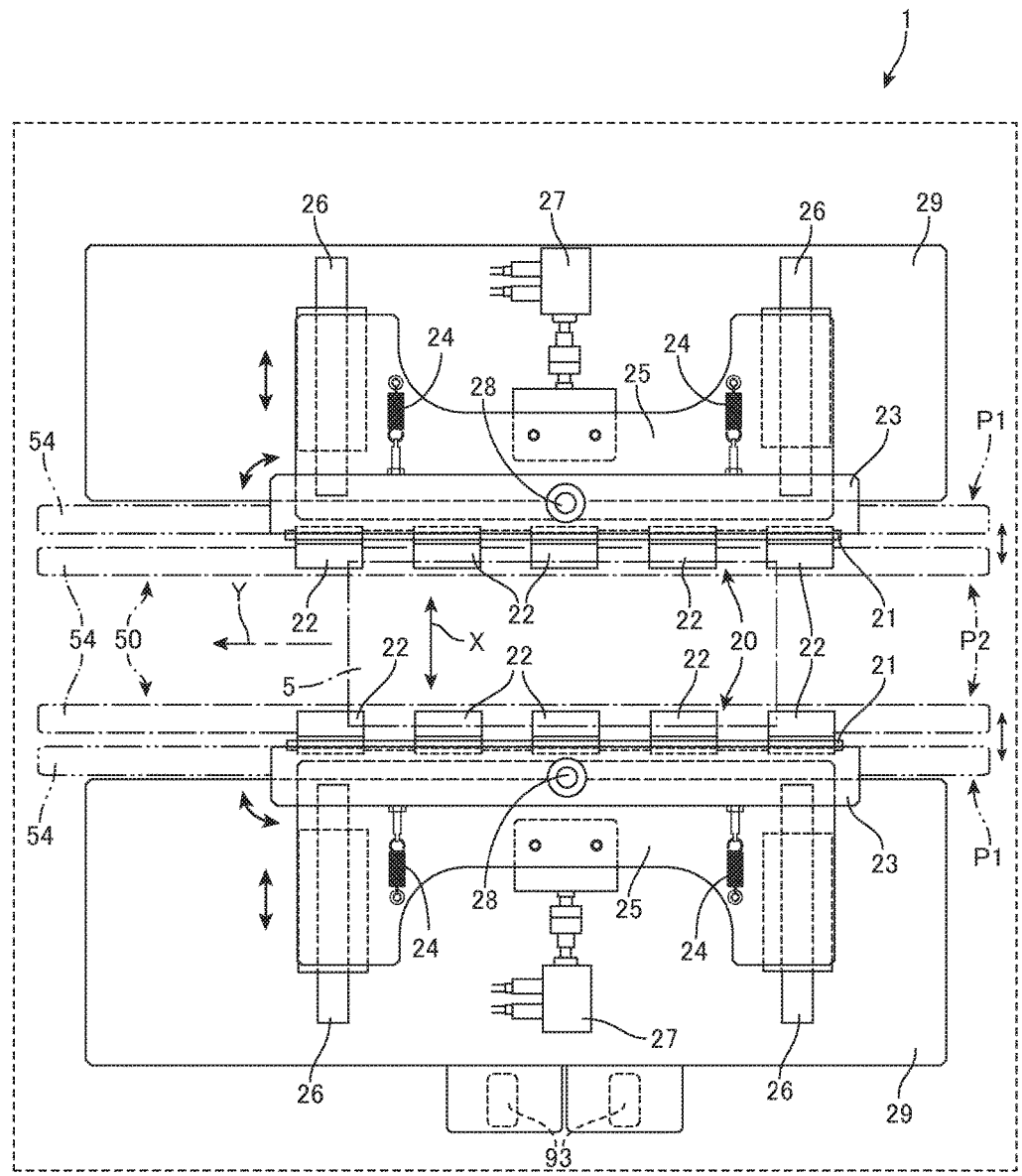
FIG. 3 is a plan view showing the area about the holding unit.

FIG. 2 is a side view showing a state where the holding unit 20, the conveying unit 50, and the stocker 10 have been disposed in that order from the top. FIG. 3 is a plan view showing a state where the holding unit 20, the conveying unit 50, and the stocker 10 have been disposed in that order from the top, when looking from above the holding unit 20. In these figures, a plurality of rectangular substrates are stacked on the stocker 10 of the substrate supplying apparatus 1, and from the plurality of stacked substrates 6, the uppermost rectangular substrate 5 is separated using the holding unit 20 one at a time by holding both ends along the longitudinal direction Y, that is in the shorter axis direction (width direction) X of the substrate 5. The separated substrate 5 is conveyed in the longer axis direction (conveying direction) Y using the conveying unit 50. With the substrate supplying apparatus 1, by changing the stacking direction of the substrates, it is also possible to hold both ends in the longer axis direction Y of the substrate 5 to separate and to convey the substrate 5 in the shorter axis direction X.

The holding unit (or "holder") 20 includes a plurality of pairs, in the present embodiment five pairs, of pads (chucking pads) 22 that sandwich and clamp both ends in the width direction (shorter axis direction) X of the substrate 5 in a state where the pads are tilted in a V shape (an "inverted V shape", a "triangle with an open base", an "inwardly inclined shape", or "a shape that is inclined so as to widen at the bottom"). The holding unit 20 includes a pair of first support plates 23 that support the five pairs of pads 22 along the conveying direction (longer axis direction) Y of the substrate 5. The holding unit 20 further includes a pair of second support plates 25 that support the respective first support plates 23 so as to rotate toward the front and back with respect to the conveying direction Y via pillars (rotational shafts) 28 disposed in substantially the centers of the first support plates 23. The holding unit 20 further includes springs 24 that are disposed in the front/rear direction (Y direction) of the pillars 28 of the second support plates 25 and elastically set the angles of rotation of the first support plates 23 to the respective second support plates 25.

The holding unit 20 further includes two pairs of guides 26 that support the respective second support plates 25 so as to slide in the width direction X, a pair of air cylinders (actuators) 27 that move the respective second support plates 25 in the width direction X, and base plates 29 on which the guides 26 and the actuators 27 are mounted.

The pads 22 that touch both ends of the substrate 5 to be separated as well as after being separated are made of urethane (rigid urethane) with a suitable elasticity. The opposite sides of the pads 22 (rear sides of the pads 22) to the surfaces that touch the substrate 5 are attached to the first support plates 23 by fixing plates (holder plates) 21 made of metal that are shaped into a state where the lower parts thereof are inclined so as to widen to the outside in the width direction X. More specifically, as shown in FIG. 2, the holder plates 21 are formed so that the upper parts that are attached to the first support plates 23 are substantially vertical and the lower parts are bent toward the outside in the width direction X. The pads 22 are attached to the first support plates 23 by the plates 21 in a state where it is extended (protruded) so that the lower part thereof widen and are configured so that the substrate 5 is sandwiched at a position that is beyond (i.e., further below) the first support plates 23 of the pads 22. The holder plates 21 may be flat plates that are not bent and may be attached to the first support plates 23 in a state where the lower parts thereof are inclined so as to widen toward the outside in the width direction X.

The stocker 10 that positioned below the holding unit 20 during separating and feeding, includes a pair of rod-shaped supports 11 for the workpieces that extend to the front and rear along the conveying direction Y of the substrate 5 and support the plurality of stacked substrates 6 at positions that are slightly to the inside of both ends in the width direction X. The workpiece supports 11 are connected to the air cylinders 42 (see FIG. 1) that are moving units that move the stocker 10 up and down by the pair of support members 12 and the transmission members 43 that extend up and down. The stocker 10, in the process that separates the substrate 5, holds the plurality of substrates 6 below the holding unit 20.

The stocker 10 moves up and down inside a pair of guides 13 which are provided so as to touch both ends of the substrates 6. Upper parts of the guides 13 are formed so as to widen toward the top in the width direction X, so that, when the stocker 10 is lowered after the stocker 10 is raised and the uppermost substrate 5 out of the substrates 6 is separated by the holding unit 20, the substrates 6 on the stocker (lifter) 10 pass the space sandwiched by the guides 13. Accordingly, whenever the stocker 10 moves up and down, both ends of the substrates 6 stacked on the stocker 10 are aligned into a predetermined state by the guides 13 so that a substrate can be stably separated by the holding unit 20.

The conveying unit 50 becomes positioned between the holding unit 20 and the stocker 10 in a state where the stocker 10 has been lowered. The conveying unit 50 includes a pair of belt conveyors (feeding units) 54 that feed the substrate 5 in the conveying direction Y in a state where the lower surface (backside surface, underside surface) at both ends of the separated substrate 5 is supported, a pair of conveyor supporting units 56 that support the belt conveyors 54 via rollers 55 and move the belt conveyors 54 in and out above the stocker 10, and actuators (air cylinders) 59 that move the conveyor support units 56 in and out (forward and backward, left and right) in the width direction X with respect to the stands 9 that form the base of the conveying unit 50. The respective conveyor support units 56 include a motor 55m that drives the belt conveyor 54, and a member (guide portion) 57 that guides the substrate 5 released from the holding unit 20 to a predetermined position on the belt conveyor 54.

As shown in FIG. 3, in the conveying unit 50, the belt conveyors 54 move in and out with the width direction X below the holding unit 20 to a first position P1 that is a standby position and a second position P2 that protrudes below the substrate 5 so as to convey the substrates 5, which are separated one at a time by the holding unit 20 on the second position P2. Note that FIG. 2 depicts a state where the conveying unit 50 is withdrawn to the first position P1.

The substrate feeding apparatus 1 also includes a sensor 93 that detects whether a substrate 5 is present or not. The sensor 93 detects that the stocker 10 has been raised and the uppermost (top) substrate 5 in the stacked substrates 6 stacked on the stocker 10 has reached the position where the pads 22 of the holding unit 20 clamp the substrate 5. In addition, since the sensor 93 detects whether the substrate 5 is present at the position where the pads 22 of the holding unit 20 clamp the substrate 5, it is possible to confirm that the substrate 5 has been separated by the holding unit 20 by detecting the substrate 5 using the sensor 93 after the stocker 10 is lowered.

FIGS. 4A to 4E schematically show the steps of the process that clamps, separates, and feeds (conveys) a substrate 5 from the plurality of substrates 6 stacked on the stocker 10 one at a time in order, according to the control by the feeding function 71 of the control unit 70. Also, FIG. 5 shows the process to separate and feed a substrate 5 by way of a flowchart.

Figure 4:
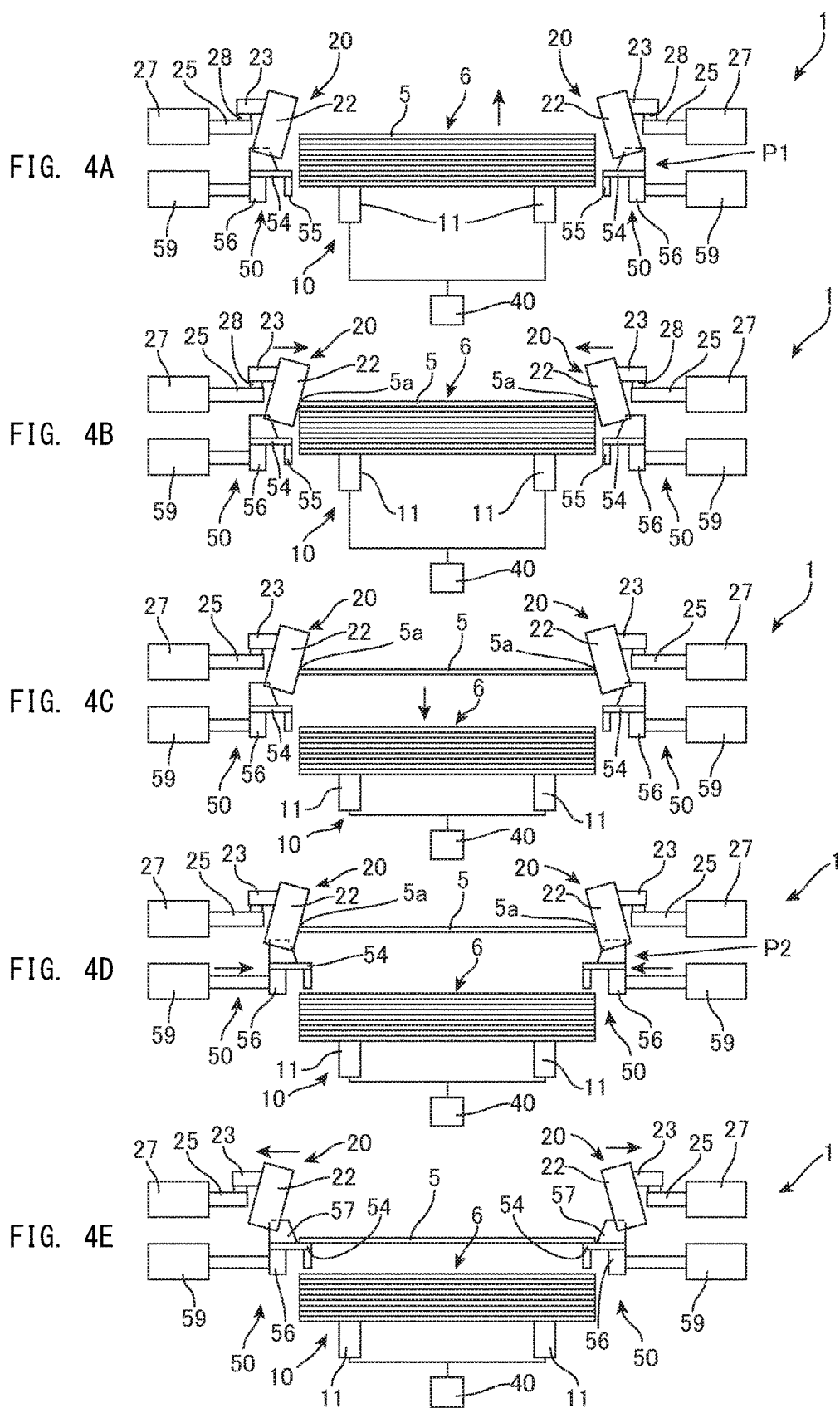
FIGS. 4A to 4E are schematic diagrams depicting how workpieces are processed by the system, where
Figure 5:
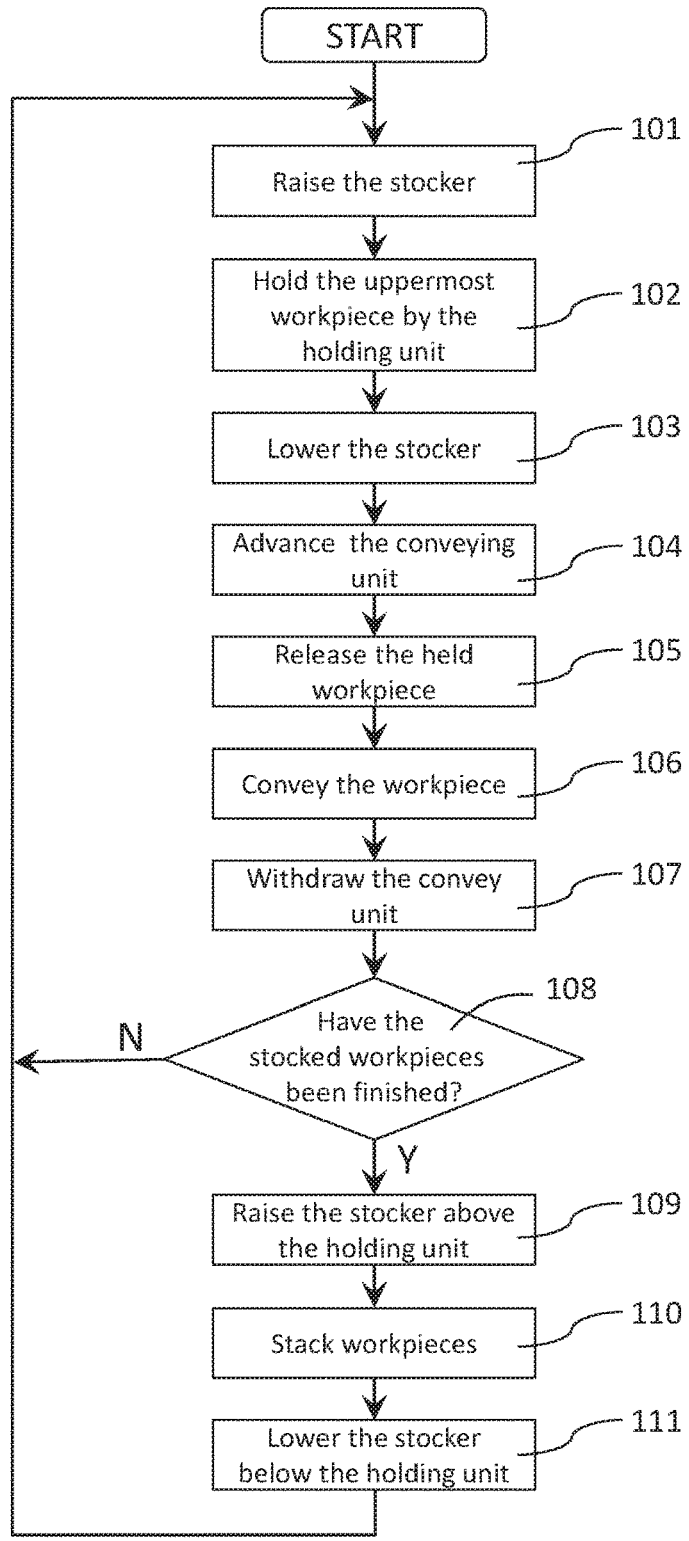
FIG. 5 is a flowchart showing a process how the system separates and supplies a workpiece.

In step 101, as shown in FIG. 4A, the moving unit 40 moves (raises) the stocker 10 until the uppermost substrate 5 in the plurality of substrates 6 stocked on the stocker 10 reaches a holding position of the pads 22 of the holding unit 20. The position of the uppermost substrate 5 is monitored by the sensor 93. Note that in the meantime the conveying unit 50 is withdrawn from both ends of the plurality of substrates 6 mounted on the stocker 10 to the outside and withdrawn from the space in which the substrates 6 are moved up and down to the position P1.

In step 102, as shown in FIG. 4B, the actuators 27 of the holding unit 20 slide the first support plates 23 via the second support plates 25 in the width direction X so that the pads 22 that are inverse V-shaped sandwich and clamp both ends of the substrate 5 at the top. The first support plates 23 that support the plurality of pairs of pads 22 are configured to rotate about the pillar portions 28 in the conveying direction Y with respect to the second support plates 25 respectively. By this configuration, it is possible to reliably sandwich and clamp the substrate 5 using the pads 22 even if, when holding the substrate 5 by the pads 22, the substrate 5 is slightly inclined or somewhat tilted in the up-down direction and the distances where the left and right pads 22 clamp the substrate 5 change along the front and rear of the conveying direction.

In more detail, the holding unit 20 of the substrate feeding apparatus 1 sandwiches both ends of the substrate 5 using the pads 22 that are inverted V-shaped so that the lower parts thereof widen. Accordingly, in a state where the pads 22 touches both ends 5a of the substrate 5 at the top of the plurality of stacked substrates 6 and the substrate 5 is clamped by the pads 22, the pads 22 whose lower parts widen do not touch (contact) the second substrate of the plurality of substrates 6. By raising the pads 22 (the holding unit 20) or lowering the stocker 10 that supports the stacked substrates 6 in that state, it is possible to separate the uppermost substrate 5 at the top of the stacked substrates 6 from the other stacked substrates 6.

The plurality of pairs of pads 22 are intermittently disposed along the conveying direction Y and the first support plates 23 that support the pads 22 rotate forward and backward in the conveying direction Y. This means that when the substrate 5 is clamped by a plurality of pairs of pads 22, the distances (gaps) in the width direction X between the plurality of pairs of pads 22 disposed along the conveying direction Y can be automatically changed and the plurality of pairs of pads 22 can rotate in parallel depending on the posture of the substrate 5.

If the uppermost substrate 5 is inclined in the front-rear direction and/or the left-right direction together with the plurality of stacked substrates 6 or only by itself for some reason. Since the plurality of pads 22 are formed so that the lower parts widen, if the substrate 5 to be held is inclined, the positions (heights) contacted by the plurality of pads 22 change and there can be variation in the clamping width of both ends of the substrate 5. For example, if the substrate 5 to be held is inclined in the front/rear direction, the front part of the substrate 5 contacts the upper parts of the inverted V-shaped pads 22, which results in relatively widening the distance between the front pads 22 to hold by the pads 22, and the rear part of the substrate 5 contacts the lower parts of the inverted V-shaped pads 22, which results in relatively narrowing the distance between the rear pads 22. Since the distance between the rear pads 22 narrows as the distance between the front pads 22 widens by the first support plates 23, the front and rear pads 22 can reliably clamp the substrate 5 that is inclined in the front/rear direction using the front and rear pads 22.

Also, there are cases where the uppermost substrate 5 is not parallel with the conveying direction Y. By making it possible to change the distances between the plurality of pads 22 at the front and rear (upstream and downstream) in the conveying direction Y, it is possible to reliably clamp and separate even a substrate 5 in this state using the holding unit 20.

In addition, the holding unit 20 has a pair of spring members 24 disposed on both sides of the pillar portions 28. The spring members 24 restrict the range of rotation of the first support plate 23 and make the pressure to clamp both ends 5a of the substrate 5 substantially equal to the respective pads 22 via the first support plates 23, even when the first support plates 23 have rotated. This means that when an inclined tilted substrate 5 is clamped by the pads 22 and separated, the orientation of the substrate 5 is corrected by the spring members 24 so as to become parallel to the conveying direction Y. The positions of the plurality of pads 22 are also reset to the initial positions.

The holding unit 20 is capable of adjusting the force that internally drives the first support plates 23 and clamps the substrate 5 via the pads 22 by controlling the actuators 27. Accordingly, even if the substrate 5 to be separated is a thin substrate or a thick substrate, it is possible to clamp the substrates 5 to be separated with a force that is appropriate for the kinds or thicknesses of substrates basis and possible to completely eliminate the risk of damage to the substrate 5 when the substrate is separated.

The holding unit 20 clamps (chucks) both end portions 5a of the substrate 5 using a plurality of pairs of pads 22 that have inverted V-shaped. It is possible to separate the substrate 5 without being affected by the state of the surface of the substrate 5. For example, even if through holes or the like have been formed in the substrate 5 or the substrate (workpiece) has already been implemented so that circuit components or the like have been mounted on the surface of the substrate, it is possible to reliably clamp and separate the substrate 5 since the pads 22 only clamp both ends 5a. In addition, since the pads 22 only clamp both end portions 5a of the substrate 5, the pads 22 substantially do not touch the surface of the substrate 5, which greatly reduces the risk of the pads 22 marking or damaging the surface of the substrate 5 during the separation.

As holding the substrate 5 to be separated by the holding unit 20, in step 103, as shown FIG. 4C, the stocker 10 is lowered by the moving unit 40. By doing so, the substrate 5 held by the holding unit 20 is separated from the other substrates 6 that are stacked on the stocker 10.

In step 104, as shown in FIG. 4D, the conveying unit 50 is set or advanced between the holding unit 20 and the stocker 10. More specifically, the belt conveyors (feeding units) 54 of the conveying unit 50 are advanced by the actuators 59 from the first position P1, where they have been withdrawn, to the space where the substrates 6 move up and down and set (moved) to the second position P2 between the holding unit 20 below and the stocker 10 above.

In step 105, as shown in FIG. 4E, the actuators 27 withdraws the first support plates 23 in the width direction X. By doing so, the pads 22 are moved off both ends 5a of the substrate 5 to release the substrate 5 from the holding unit 20. The released substrate 5 that has been separated as one substrate and released by the holding unit 20 is placed on the belt conveyors 54 that have moved below the holding unit 20 and is conveyed or fed by the belt conveyors 54 in step 106. One or more pairs of V-shaped guide portions 57 that become narrower toward the bottom are disposed above the belt conveyors 54 and move together with the conveyors 54. By the guide portions 57, it is possible to guide both ends 5a of the released substrate 5 so that the substrate 5 becomes reliably loaded on (put on) the belt conveyors 54.

When the substrate 5 has been discharged from the substrate feeding apparatus 1, in step 107, the belt conveyors 54 of the conveying unit 50 is withdrawn to the first position P1. In step 108, if the feeding of the substrates 6 stocked on the stocker 10 have not been completed, the procedure returns to step 101 (FIG. 4A), and the process that separates and conveys the next substrate 5 is repeated. By doing so, it is possible to separate and convey the substrate 5 one by one from the plurality of substrates 6 that have been stacked on the stocker 10.

When the substrates 6 stacked on the stocker 10 have been finished (completed) in step 108, the stocker 10 is further raised above the holding unit 20 in step 109, the plurality of next substrates 6a (a bundle of substrates 6a) set on the loading unit 60 are moved to stack on the stocker 10 in step 110. The stocker 10 is lowered below the holding unit 20 in step 111, and the procedure returns to step 101 to repeat the process of separating the substrate from a plurality of substrates 6a and supplying the substrate.

The workpiece (substrate) 5 separated and supplied by the substrate feeding apparatus 1 referred to above may be a printed circuit board (wiring substrate) as in the above description, may be a semiconductor substrate, or another plate-like workpiece, such as a glass plate, a resin plate, or a piece of lumber, and so long as it is possible to clamp both ends of a workpiece with the workpieces in a stacked state, it is also possible to separate containers or the like as workpieces. Accordingly, it is possible to use the substrate feeding apparatus in a wide range of fields such as foodstuffs and building materials without being limited to electric components and electronic components.

Also, although the substrate feeding apparatus 1 described above clamps both ends 5a of the substrate 5 to be separated using a plurality of pairs of pads 22, a configuration that clamps both ends 5a of the substrate 5 with a pair (one pair) of pads 22 that extend in the conveying direction is also possible. By using a configuration with a plurality of pairs of pads 22, it is possible to clamp the substrate 5 while distributing the clamping force so as to be intermittent along the conveying direction Y of the substrate 5. Even if there is partial abrasion or damage to some of the pads 22, it is sufficient to replace only the pads 22 in question. That makes it possible to provide a low-cost and ease of maintenance apparatus 1. The number of pads is not limited to five pairs and may be four pairs or fewer, or six pairs or more, and the pads that compose the pairs do not necessarily have to be disposed at positions that are opposite one another. The pads 22 do not have to be made of urethane and may be formed of another plastic material or may be made of rubber.

The mechanism that moves the holding unit 20, the moving unit 40, the conveying unit 50, the first width changing unit 64, the second width changing unit 92 and the like by sliding described above, are merely examples and it is also possible to use a variety of moving mechanisms, such as slide rails, a rack and pinion, and a table. Also, although air cylinders have been described as examples of actuators, it is also possible to use a variety of actuators, such as electric cylinders, hydraulic cylinders, motors, solenoids, and linear actuators.

The invention claimed is:

1. A system comprising:
   a stocker that is configured to store a plurality of workpieces in a stacked state on the stocker;
   a holding unit including at least one pair of pads that form an inverted V-shaped along a conveying direction and configured to sandwich and clamp both ends of a width direction of one of the workpieces, wherein the width direction is cross to the conveying direction;
   a moving unit that is configured to move the stocker downward with respect to the holding unit and the one of the workpieces clamped by the at least one pair of pads is separated from other workpieces;
   a conveying unit that is configured to relatively move in and out below the holding unit and convey the separated workpiece released from the holding unit, wherein the conveying unit includes a pair of feeding units that is configured to convey the separated workpiece in the conveying direction with supporting the both ends of a lower surface of the separated workpiece;
   a pair of stands that are configured to support both the holding unit and the conveying unit at the fixed heights respectively, wherein the pair of stands extend in an up and down direction and the stocker moves up and down between the pair of stands; and
   a width changing unit that is configured to adjust integrally, by changing a distance between the pair of stands, a distance for separating the one of workpieces by the at least one pair of pads of the holding unit and a distance for conveying the separated workpiece by the pair of feeding units of the conveying unit to match a width of the plurality of workpieces to be separated and conveyed.

2. The system according to claim 1,
   wherein the pair of feeding units are configured to move to first positions, which are below the holding unit and are withdrawn to an outside from both ends of the plurality of workpieces, and to second positions, which are located inside of the first positions so that under sides of both ends of the one of the workpieces are loaded on the pair of the feeding units.

3. The system according to claim 1,
   wherein the holding unit includes a driving unit that opens and closes the at least one pair of pads relative to the both ends of the one of the workpieces.

4. The system according to claim 1,
   wherein the holding unit includes a support unit that is configured to support the at least one pair of pads in a state where the at least one pair of pads are pressed onto the both ends of the one of the workpieces so that a distance between the at least one pair of pads varies along the conveying direction.

5. The system according to claim 4,
   wherein the holding unit includes a plurality of pairs of the pads and the support unit supports the plurality of pairs of the pads so that distances between the plurality of pads vary along the conveying direction.

6. The system according to claim 1,
   wherein the moving unit is configured to move the stocker above the holding unit to the position where the plurality of workpieces are stacked on the stocker.

7. A method that includes separating one of workpieces from other workpieces by using a system, the system including a stocker that is configured to store the plurality of plate-like workpieces in a stacked state on the stocker; a holding unit with at least one pair of pads that form an inverted V-shape and arranged along a conveying direction to clamp both ends of a width direction that is cross to the conveying direction, of the one of the workpieces; a conveying unit that is configured to relatively move in and out below the holding unit and includes a pair of feeding units that is configured to convey the one of workpieces separated with supporting the both ends of a lower surface of the separated workpiece; and a pair of stands that are configured to support both the holding unit and the conveying unit at fixed heights respectively, wherein the pair of stands extend in an up and down direction and the stocker moves up and down between the pair of stands,
   wherein the separating comprises:
   moving the stocker so that the at least one pair of pads hold an uppermost workpiece stacked on the stocker;
   moving the stocker, after the pair of pads have held the uppermost workpiece as the one of the workpieces, so that the stocker moves downward with respect to the holding unit to separate the one of the workpieces,
   setting the conveying unit between the holding unit and the stocker;
   releasing the one of the workpieces held by the at least one pair of pads;
   conveying the released workpiece using the conveying unit;
   withdrawing the conveying unit from between the stocker and the holding unit; and
   adjusting integrally, by changing a distance between the pair of stands, a distance for separating the one of workpieces by the at least one pair of pads of the holding unit and a distance for conveying the separated workpiece by the pair of feeding units of the conveying unit to match a width of the plurality of workpieces to be separated and conveyed.

8. The method according to claim 7,
   wherein the method further comprises:
   moving the stocker above the holding unit to the position where the plurality of workpieces are stacked on the stocker; and
   moving the stocker on which the plurality of workpieces are stacked below the holding unit.

* * * * *